United States Patent
Metze et al.

(10) Patent No.: US 10,559,593 B1
(45) Date of Patent: Feb. 11, 2020

(54) FIELD-EFFECT TRANSISTORS WITH A GROWN SILICON-GERMANIUM CHANNEL

(71) Applicant: GLOBALFOUNDRIES Inc., Grand Cayman (KY)

(72) Inventors: Carsten Metze, Dresden (DE); Berthold Reimer, Dresden (DE); Simeon Morvan, Dresden (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/102,066

(22) Filed: Aug. 13, 2018

(51) Int. Cl.
*H01L 27/12* (2006.01)
*H01L 21/02* (2006.01)
*H01L 21/8234* (2006.01)
*H01L 21/321* (2006.01)
*H01L 21/324* (2006.01)
*H01L 21/762* (2006.01)

(52) U.S. Cl.
CPC ...... *H01L 27/1203* (2013.01); *H01L 21/0245* (2013.01); *H01L 21/324* (2013.01); *H01L 21/32105* (2013.01); *H01L 21/7624* (2013.01); *H01L 21/8234* (2013.01)

(58) Field of Classification Search
CPC .......................... H01L 27/1203; H01L 27/1207
See application file for complete search history.

(56) References Cited

U.S. PATENT DOCUMENTS

| | | | | |
|---|---|---|---|---|
| 5,726,459 A * | 3/1998 | Hsu | .......................... | H01L 21/84 257/55 |
| 6,339,232 B1 * | 1/2002 | Takagi | .................... | H01L 21/84 257/190 |
| 6,380,590 B1 * | 4/2002 | Yu | .......................... | H01L 21/84 257/289 |
| 7,141,459 B2 | 11/2006 | Yang et al. | | |
| 7,989,327 B2 | 8/2011 | Vincent et al. | | |
| 8,987,069 B1 | 3/2015 | Adam et al. | | |
| 9,236,380 B2 * | 1/2016 | Morin | .................... | H01L 27/092 |
| 9,583,378 B2 | 2/2017 | Cheng et al. | | |
| 9,659,960 B1 | 5/2017 | Cheng et al. | | |
| 2002/0038898 A1 * | 4/2002 | Sugiyama | ............... | H01L 21/84 257/378 |
| 2007/0059875 A1 * | 3/2007 | Mishima | ............... | H01L 21/268 438/199 |
| 2009/0218633 A1 * | 9/2009 | Hoentschel | ..... | H01L 21/823807 257/369 |

(Continued)

*Primary Examiner* — Scott B Geyer
(74) *Attorney, Agent, or Firm* — Thompson Hine LLP

(57) ABSTRACT

Structures for a field-effect transistor and methods of forming a structure for a field-effect transistor. A first channel region containing a first semiconductor material and a second channel region containing a second semiconductor material are formed over a buried insulating layer of a silicon-on-insulator substrate. A first gate electrode of a first field-effect transistor is formed over the first channel region. A second gate electrode of a second field-effect transistor is formed over the second channel region. The first semiconductor material of the first channel region has a first germanium concentration. The second semiconductor material of the second channel region has a second germanium concentration that is greater than the first germanium concentration in the first semiconductor material of the first channel region.

20 Claims, 4 Drawing Sheets

(56) References Cited

U.S. PATENT DOCUMENTS

| | | | |
|---|---|---|---|
| 2012/0153350 A1* | 6/2012 | Kronholz | H01L 21/26506 257/190 |
| 2013/0193514 A1* | 8/2013 | Loubet | H01L 21/84 257/347 |
| 2013/0277747 A1* | 10/2013 | Liu | H01L 21/26506 257/368 |
| 2014/0203364 A1* | 7/2014 | Tsunomura | H01L 29/66742 257/347 |
| 2014/0252503 A1* | 9/2014 | Chudzik | H01L 21/0214 257/411 |
| 2015/0270349 A1* | 9/2015 | Cheng | H01L 29/161 257/9 |
| 2016/0197018 A1* | 7/2016 | Andrieu | H01L 21/84 438/155 |
| 2017/0047331 A1* | 2/2017 | Chen | H01L 29/7848 |
| 2019/0312041 A1 | 10/2019 | Smith et al. | |

\* cited by examiner

FIELD-EFFECT TRANSISTORS WITH A GROWN SILICON-GERMANIUM CHANNEL

BACKGROUND

The invention relates generally to integrated circuits and, in particular, to structures for a field-effect transistor and methods of forming a structure for a field-effect transistor.

Complementary-metal-oxide-semiconductor processes may be used to build a combination of n-type and p-type field-effect transistors that are used to construct logic gates and that are used as active components in other types of circuits, such as switches found in radiofrequency circuits. Field-effect transistors generally include a channel region, a source, a drain, and a gate electrode. When a control voltage exceeding a characteristic threshold voltage is applied to the gate electrode, carrier flow occurs in the channel region between the source and drain to produce a device output current.

A semiconductor-on-insulator substrate permits device operation at significantly higher speeds with improved electrical isolation and reduced electrical losses in comparison with field-effect transistors built using a bulk silicon wafer. Contingent on the thickness of a device layer of the semiconductor-on-insulator substrate, a field-effect transistor may operate in a fully-depleted mode in which a depletion layer in the channel region extends fully to a buried insulating layer of the semiconductor-on-insulator substrate when typical control voltages are applied to the gate electrode.

The channel region of a p-type field-effect transistor may be composed of silicon-germanium. A conventional approach to form the silicon-germanium channel region is to form a silicon-germanium layer on a portion of the device layer of the semiconductor-on-insulator substrate and to perform a thermal condensation process that transfers the germanium to the device layer. However, silicon-germanium channel regions formed by the thermal condensation of a silicon-germanium layer are limited to having a single germanium content.

Improved structures for a field-effect transistor and methods of forming a structure for a field-effect transistor are needed.

SUMMARY

In an embodiment of the invention, a method includes forming a first channel region containing a first semiconductor material and a second channel region containing a second semiconductor material over a buried insulating layer of a silicon-on-insulator substrate, forming a first gate electrode of a first field-effect transistor over the first channel region, and forming a second gate electrode of a second field-effect transistor over the second channel region. The first semiconductor material of the first channel region has a first germanium concentration. The second semiconductor material of the second channel region has a second germanium concentration that is greater than the first germanium concentration in the first semiconductor material of the first channel region.

In an embodiment of the invention, a structure includes a first field-effect transistor having a first channel region arranged over a buried insulating layer of a silicon-on-insulator substrate and a first gate electrode arranged over the first channel region. The first channel region contains a first semiconductor material having a first germanium concentration. The structure further includes a second field-effect transistor having a second channel region arranged over the buried insulating layer of the silicon-on-insulator substrate and a second gate electrode arranged over the second channel region. The second channel region contains a second semiconductor material having a second germanium concentration that is greater than the first germanium concentration in the first semiconductor material of the first channel region.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
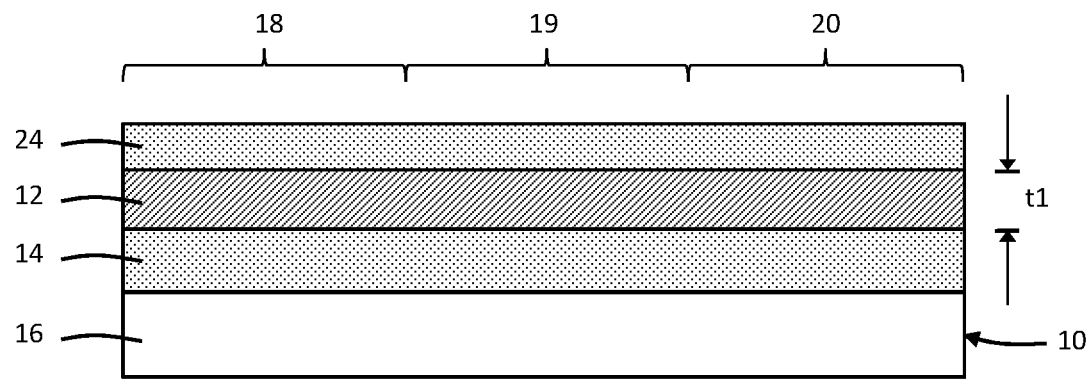
FIGS. 1-8 are cross-sectional views of a structure at successive fabrication stages of a process in accordance with embodiments of the invention.

With reference to FIG. 1 and in accordance with an embodiment of the invention, a silicon-on-insulator (SOI) wafer 10 includes a device layer 12, a buried insulating layer 14 that may be composed of an oxide of silicon (e.g., $SiO_2$), and a substrate 16. The device layer 12 and the substrate 16 may be composed of a single-crystal semiconductor material, such as single-crystal silicon. The device layer 12 is separated from the substrate 16 by the intervening buried insulating layer 14 and may be considerably thinner than the substrate 16. In an embodiment, the device layer 12 may have a thickness, t1, that is compatible with the fabrication of fully-depleted SOI devices (FDSOI). The buried insulating layer 14 directly contacts the substrate 16 along an interface and directly contacts the device layer 12 along another interface, and these interfaces are separated by the thickness of the buried insulating layer 14 and may terminate at the outer rim of the SOI wafer 10. The substrate 16 may be lightly doped to have, for example, p-type conductivity.

The device layer 12 may be considered to include a device area 18, a device area 19, and a device area 20. The device area 18 and the device areas 19, 20 may be used in the process flow to fabricate field-effect transistors characterized by different conductivity types. The device areas 18, 19, 20 may be implanted to provide p-wells and n-wells (not shown) that may be needed for subsequent device fabrication.

A hardmask or pad layer 24 is formed on a top surface of the device layer 12. The pad layer 24 may be composed of a dielectric material, such as silicon dioxide ($SiO_2$) grown by thermal oxidation of the device layer 12.

Figure 2:
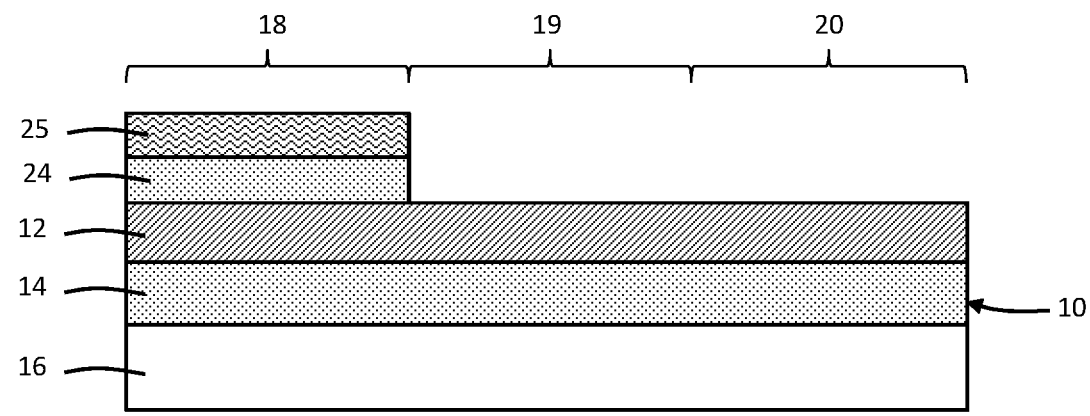

With reference to FIG. 2 in which like reference numerals refer to like features in FIG. 1 and at a subsequent fabrication stage, the pad layer 24 is removed from the device areas 19, 20 to expose the underlying device layer 12. To that end, an etch mask 25 is formed by lithography over the top surface of the device layer 12. The etch mask 25 fully covers the pad layer 24 in device area 18 and exposes the pad layer in device areas 19, 20. The etch mask 25 may be composed of a layer of a photosensitive material, such as an organic photoresist, that may be applied as a fluid by a spin coating process, pre-baked, exposed to light projected through a photomask, baked after exposure, and developed with a chemical developer.

The exposed portion of the pad layer 24 may be removed from the device layer 12 in the section of device areas 19, 20 using an etching process, such as a wet chemical etching process or reactive ion etching (RIE), that removes the pad layer 24 selective to the device layer 12. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. The pad layer 24 in device area 18 is protected by the etch mask 25 during the etching process. The etch mask 25 is stripped following the completion of the etching process.

Figure 3:
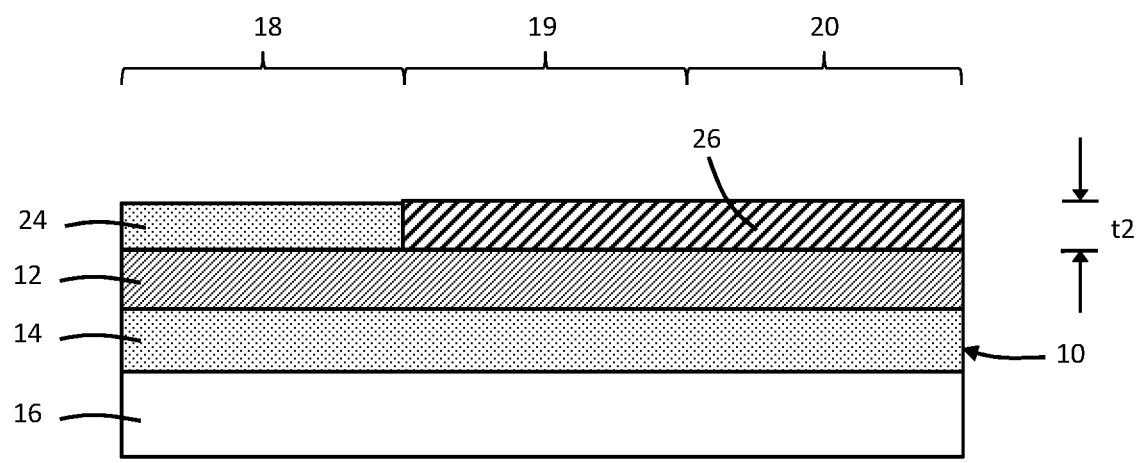

With reference to FIG. 3 in which like reference numerals refer to like features in FIG. 2 and at a subsequent fabrication stage, an epitaxial semiconductor layer 26 is formed by epitaxial growth over the device layer 12 in device area 19 and device area 20. The epitaxial semiconductor layer 26, which has a thickness t2, may be in direct contact with the top surface of the device layer 12, which provides the crystal structure serving as a template for epitaxial growth. In an embodiment, the epitaxial semiconductor layer 26 may contain germanium (Ge) and, in particular, the epitaxial semiconductor layer 26 may be composed of silicon-germanium (SiGe) having a germanium concentration (i.e., the ratio of the germanium content to the germanium and silicon content) ranging from 2% to 50%. The epitaxial semiconductor layer 26 may be formed using an epitaxial growth process, such as a selective epitaxial growth process in which the constituent semiconductor material nucleates for epitaxial growth from semiconductor surfaces, but does not nucleate for epitaxial growth from insulator surfaces (e.g., the top surface of the pad layer 24). The epitaxial semiconductor layer 26 does not form in device area 18 because of masking by the section of the patterned pad layer 24.

Figure 4:
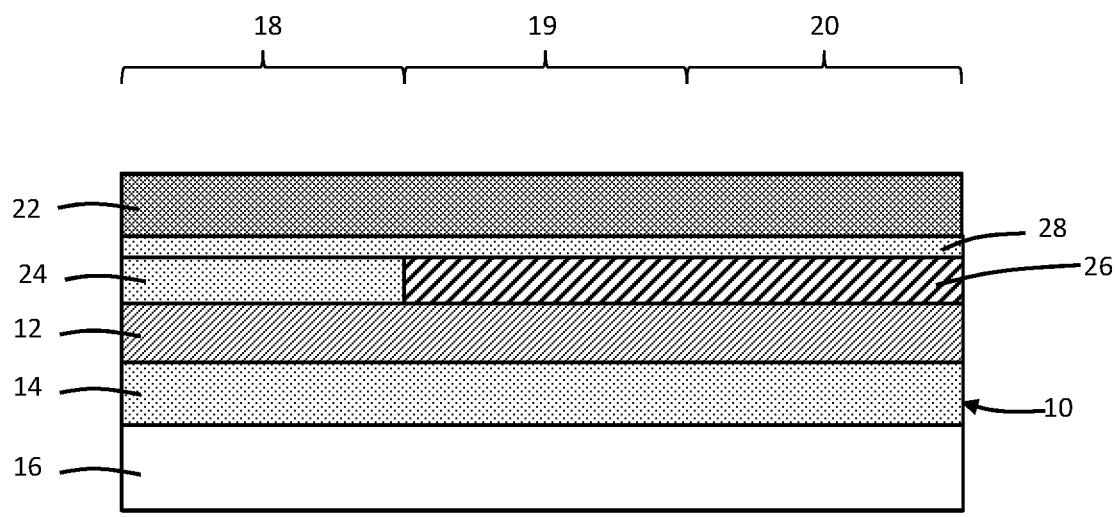

With reference to FIG. 4 in which like reference numerals refer to like features in FIG. 3 and at a subsequent fabrication stage, a hardmask layer 22 and a pad layer 28 are formed in a layer stack over the patterned pad layer 24 in device area 18 and the epitaxial semiconductor layer 26 in device areas 19, 20. The hardmask layer 22 may be composed of a dielectric material, such as silicon nitride ($Si_3N_4$), deposited by chemical vapor deposition (CVD). The pad layer 28 may be composed of a dielectric material, such as silicon dioxide ($SiO_2$), deposited by chemical vapor deposition.

Figure 5:
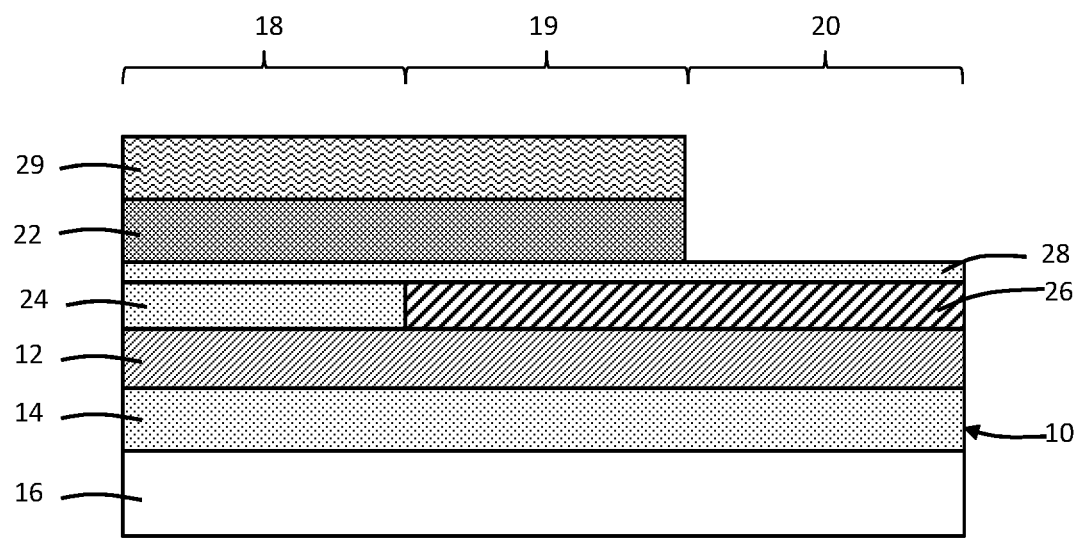

With reference to FIG. 5 in which like reference numerals refer to like features in FIG. 4 and at a subsequent fabrication stage, the hardmask layer 22 is removed from the device area 20 to expose the pad layer 28 over the underlying epitaxial semiconductor layer 26. To that end, an etch mask 29 is formed by lithography over the hardmask layer 22. The etch mask 29 may be composed of a layer of a photosensitive material, such as an organic photoresist, that may be applied as a fluid by a spin coating process, pre-baked, exposed to light projected through a photomask, baked after exposure, and developed with a chemical developer. The section of the hardmask layer 22 exposed by the etch mask 29 may be removed from the pad layer 28 in the device area 20 using an etching process, such as a wet chemical etching process using a heated phosphoric acid solution, that removes the dielectric material of the hardmask layer 22 selective to the dielectric material of the pad layer 28. The hardmask layer 22 in device area 18 and device area 19 is protected by the etch mask 29 during the etching process. The etch mask 29 is stripped following the completion of the etching process.

Figure 6:
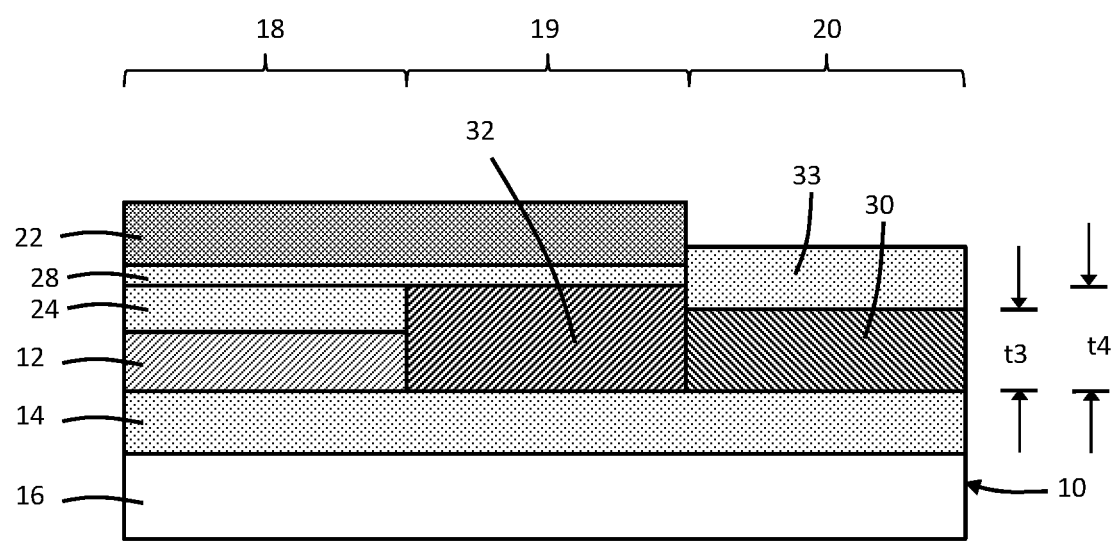

With reference to FIG. 6 in which like reference numerals refer to like features in FIG. 5 and at a subsequent fabrication stage, the device layer 12 in the device area 20 is modified in its composition using a thermal process to form a semiconductor layer 30. The semiconductor layer 30 in device area 20 may extend to the buried insulating layer 14 and may be in direct contact with the buried insulating layer 14. In that regard, the full thickness of the device layer 12 in device area 20 may be locally modified by the thermal process to form the semiconductor layer 30.

The thermal process also causes the epitaxial semiconductor layer 26 in device area 19 to combine with the underlying semiconductor material of the device layer 12 to form a semiconductor layer 32. The semiconductor layer 32 in device area 19 may also extend to the buried insulating layer 14 and may be in direct contact with the buried insulating layer 14. In that regard, the full thickness of the device layer 12 in device area 19 may combine with the epitaxial semiconductor layer 26 to form the semiconductor layer 32. The semiconductor layer 32 in device area 19 is juxtaposed with the semiconductor layer 30 in device area 20, and the semiconductor layer 32 is juxtaposed with the device layer 12 in device area 18.

The semiconductor layer 30 in device area 20 has a different composition than the device layer 12 in device area 18, the semiconductor layer 32 in device area 19 has a different composition than the device layer 12 in device area 18, and the semiconductor layer 32 in device area 19 has a different composition than the semiconductor layer 30 in device area 20. The semiconductor layer 30 and the semiconductor layer 32 are each composed of a semiconductor material having a higher carrier mobility (e.g., hole mobility) than the semiconductor material of the device layer 12. Each of the semiconductor layers 30, 32 contains single-crystal semiconductor material having a crystal structure.

In an embodiment, the thermal process producing the semiconductor layer 30 may include thermal condensation that causes germanium atoms to be transported (e.g., diffuse) from the epitaxial semiconductor layer 26 into the exposed section of the device layer 12 in device area 20. The thermal process may be performed using a rapid thermal oxidation process with the SOI wafer 10 placed in an ambient atmosphere having an oxygen content. During oxidation, the epitaxial semiconductor layer 26 oxidizes across its thickness beginning at its top surface and advancing toward the interface with the underlying device layer 12 in device area 20. Germanium atoms are irreversibly transported from the epitaxial semiconductor layer 26 into the underlying device layer 12 as oxidation proceeds. Thermal condensation is based upon, among other factors, germanium and silicon each having diamond lattice structures and the different chemical affinities between germanium and silicon with respect to oxygen. The buried insulating layer 14 rejects the diffusion of germanium such that the germanium displaced from the epitaxial semiconductor layer 26 is located entirely (i.e., confined) in the semiconductor layer 30 that is modified to be enriched in germanium.

The pad layer 28, where exposed in device area 20 by the patterning of the hardmask layer 22, is permeable to oxygen. The end result of thermal condensation is that the epitaxial semiconductor layer 26 is converted to an oxidized remnant layer 33 that is depleted of germanium (e.g., silicon dioxide ($SiO_2$)), and the section of the device layer 12 in device area 20 receiving the germanium is converted to the germanium-enriched semiconductor material (e.g., silicon-germanium (SiGe)) of the semiconductor layer 30. The germanium concentration in the semiconductor layer 30 depends on, among other factors, the thickness and composition of the device layer 12, and the germanium content and thickness of the epitaxial semiconductor layer 26. The properties of the semiconductor layer 30 may also depend on the duration of the thermal process.

The patterned hardmask layer 22, which is oxygen impermeable, covers the epitaxial semiconductor layer 26 in device area 19 and the device layer 12 in device area 18 during the performance of the thermal process. Oxygen cannot permeate from the ambient environment through the hardmask layer 22 and reach the device layer 12 in device area 18 or the section of the epitaxial semiconductor layer 26 in device area 19. The device layer 12 in device area 18 is unchanged by the thermal process. The epitaxial semiconductor layer 26 and the underlying section of the device layer 12 in device area 19 are combined by the thermal process, without (i.e., absent) thermal condensation due to the oxygen blocking, into the semiconductor layer 32 of homogenized composition. The buried insulating layer 14 rejects the diffusion of germanium such that the germanium displaced from the epitaxial semiconductor layer 26 is located entirely (i.e., fully confined) in the semiconductor layer 32 that is modified to be enriched in germanium.

The concentration of germanium of the semiconductor layer 30 in the device area 20 differs from the concentration of germanium of the semiconductor layer 32 in the device area 19, and the device layer 12 in device area 18 may be free of germanium. The semiconductor materials of the semiconductor layer 30 and the semiconductor layer 32 may incorporate compressive strain due to respective changes to their crystal structures induced by the incorporated germanium atoms, which may be effective to alter carrier mobility in operating devices built using the device areas 19, 20. Germanium atoms, which are located at lattice sites in the crystal structure of the semiconductor material of the semiconductor layers 30, 32, have a larger atomic size than, for example, silicon atoms. Generally, the lattice constant of silicon-germanium is slightly larger than the lattice constant of silicon.

The thickness, t4, of the semiconductor layer 32 in device area 19 differs from the thickness, t3, of the semiconductor layer 30 in device area 20. The thickness, t4, of the semiconductor layer 32 in device area 19 may be equal to, or substantially equal to, the sum of the thickness of the device layer 12 and the thickness of the epitaxial semiconductor layer 26. The thickness, t3, of the semiconductor layer 30 in device area 20 may be less than the sum of the thickness of the device layer 12 and the thickness of the epitaxial semiconductor layer 26. In an embodiment, the thickness, t4, of the semiconductor layer 32 in device area 19 may be greater than the thickness, t3, of the semiconductor layer 30 in device area 20.

Figure 7:
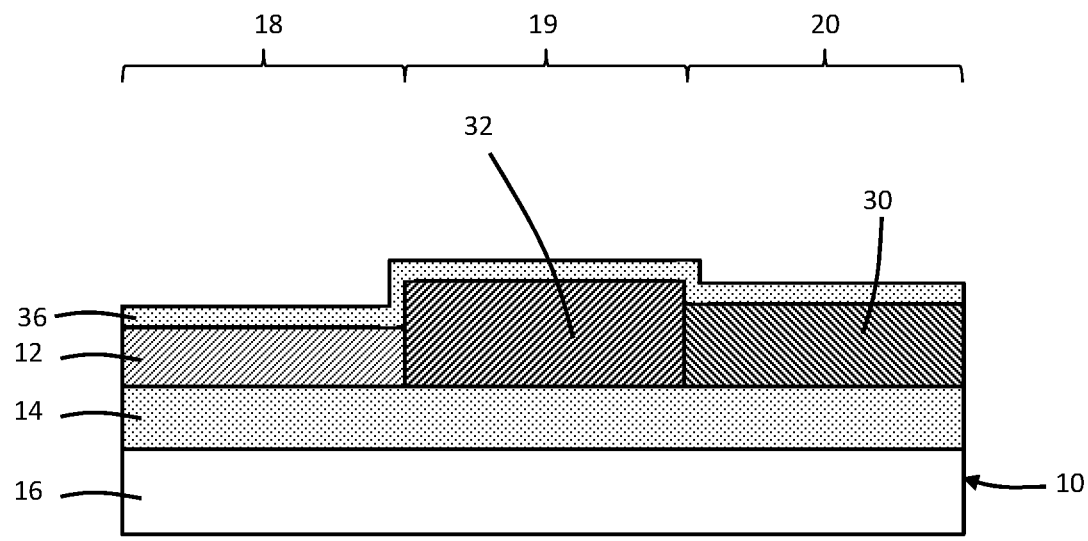

With reference to FIG. 7 in which like reference numerals refer to like features in FIG. 6 and at a subsequent fabrication stage, the remainder of the hardmask layer 22 is removed from the device areas 18, 19 using a wet chemical process, such as a heated phosphoric acid solution, to expose the pad layer 24. The pad layers 24, 28 and the oxidized remnant layer 33 are removed using a wet chemical process, such as a hydrofluoric acid solution, to expose the device layer 12 in device area 18, the semiconductor layer 32 in device area 19, and the semiconductor layer 30 in device area 20. A dielectric layer 36 may be subsequently deposited over all of the device areas 18, 19, 20.

Figure 8:
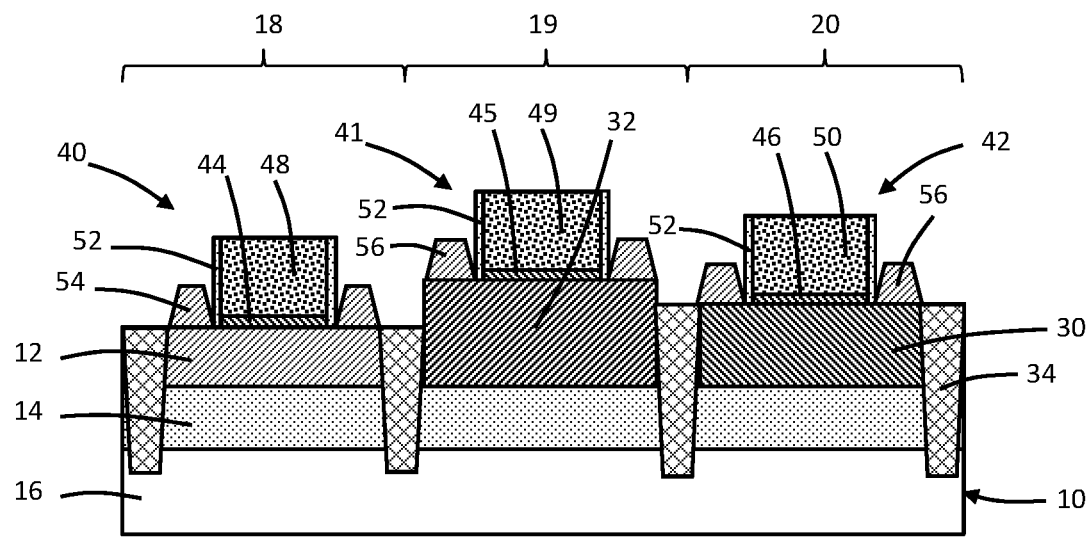

With reference to FIG. 8 in which like reference numerals refer to like features in FIG. 7 and at a subsequent fabrication stage, trench isolation regions 34 may be formed that penetrate through the device layer 12 and the buried insulating layer 14, and extend to a given depth into the substrate 16. The trench isolation regions 34 may surround the semiconductor layer 12 in device area 18, surround the semiconductor layer 32 in device area 19, and surround the semiconductor layer 30 in device area 20. The trench isolation regions 34 may be formed by a shallow trench isolation (STI) technique in which trenches are formed, and then the trenches are filled by depositing a layer of dielectric material (e.g., silicon dioxide ($SiO_2$)) followed by polishing and/or recessing the deposited layer.

Device structures 40, 41, 42 for a field-effect transistor are respectively formed by front-end-of-line (FEOL) processing in the device areas 18, 19, 20. In an embodiment, the device structure 40 may be an n-type field-effect transistor and the device structures 41, 42 may be p-type field-effect transistors. The front-end-of line processing may include depositing and patterning a dielectric layer and one or more conductor layers to form a gate dielectric 44 and gate electrode 48 of a gate structure associated with the device structure 40, to form a gate dielectric 45 and gate electrode 49 of a gate structure associated with the device structure 40, and to form a gate dielectric 46 and gate electrode 50 of a gate structure associated with the device structure 42. The gate dielectrics 44, 45, 46 may be composed of a dielectric material, such as silicon dioxide ($SiO_2$), hafnium oxide ($HfO_2$), or hafnium silicate ($HfO_4Si$), and the gate electrodes 48, 49, 50 may be composed of polysilicon or one or more conformal barrier metal layers and/or work function metal layers. In an embodiment, the gate dielectrics 44, 45, 46 may be formed from the dielectric layer 36. If the device structure 40 is an n-type field-effect transistor and the device structures 41, 42 are p-type field-effect transistors, the one or more conformal barrier metal layers and/or work function metal layers of the gate electrode 48 may differ from the one or more conformal barrier metal layers and/or work function metal layers of the gate electrodes 49, 50. Sidewall spacers 52 composed of a dielectric material may be arranged adjacent to the vertical sidewalls of the gate structures.

Source/drain regions 54 are formed adjacent to the sidewalls of the gate structure of the device structure 40 and are separated from the gate structure by the sidewall spacers 52. Source/drain regions 56 are formed adjacent to the sidewalls of the gate structures of the device structures 41, 42 and are separated from the respective gate structures by the sidewall spacers 52. As used herein, the term "source/drain region" means a doped region of semiconductor material that can function as either a source or a drain of a field-effect transistor. The source/drain regions 54 may be composed of a semiconductor material, such as silicon (Si), formed by an epitaxial growth process, and may be in situ doped during growth provide a given conductivity type (e.g., n-type conductivity for an n-type field-effect transistor). The source/drain regions 56 may be composed of a semiconductor material, such as silicon germanium (SiGe), formed by an epitaxial growth process, and may be in situ doped during growth to provide a given conductivity type (e.g., p-type conductivity for a p-type field-effect transistor).

The device layer 12 provides the channel region of the device structure 40. The semiconductor layer 32 provides the channel region of the device structure 41, and the semiconductor layer 30 provides the channel region of the device structure 42. In the representative embodiment, the source/drain regions 54 and 56 are raised relative to the respective channel regions.

Middle-of-line (MOL) processing and back-end-of-line (BEOL) processing follows the fabrication of the device structures 40, 41, 42, which includes formation of dielectric layers, via contacts, and wiring for an interconnect structure coupled with the device structures 40, 41, 42.

The channel region of the device structure 41, namely semiconductor layer 32, is formed by a thermal process without reliance upon thermal condensation, and the channel region of the device structure 42, namely semiconductor layer 30, is concurrently formed with reliance during the thermal process upon thermal condensation. The properties of the channel region of the device structure 41 are fixed, whereas the properties of the channel region of the device structure 42 are variable and can be tuned via, for example, the anneal time during the thermal process. Additional channel regions with different properties may be formed, for example, by depositing, covering with the hardmask layer 22, and thermally processing a silicon-germanium layer with a different germanium content and/or thickness in a different device area of the SOI wafer 10.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a first field-effect transistor including a first channel region arranged over a buried insulating layer of a silicon-on-insulator substrate and a first gate electrode arranged over the first channel region, the first channel region comprised of a first semiconductor material having a first germanium concentration;
    a second field-effect transistor including a second channel region arranged over the buried insulating layer of the silicon-on-insulator substrate and a second gate electrode arranged over the second channel region, the second channel region comprised of a second semiconductor material having a second germanium concentration that is greater than the first germanium concentration in the first semiconductor material of the first channel region; and
    a third field-effect transistor including a third channel region and a third gate electrode arranged over the third channel region, the third channel region comprised of a section of a device layer of the silicon-on-insulator substrate,
    wherein the third channel region has a first thickness, and the second channel region has a second thickness that is greater than the first thickness of the third channel region.

2. The structure of claim 1 wherein the first channel region has a third thickness, and the second thickness of the second channel region differs from the third thickness of the first channel region.

3. The structure of claim 1 wherein the first channel region has a third thickness, and the second thickness of the second channel region is less than the third thickness of the first channel region.

4. The structure of claim 1 wherein the first channel region is arranged in direct contact with the buried insulating layer of the silicon-on-insulator substrate.

5. The structure of claim 1 wherein the second channel region is arranged in direct contact with the buried insulating layer of the silicon-on-insulator substrate.

6. The structure of claim 1 wherein the first channel region has a third thickness that is greater than the first thickness of the third channel region.

7. The structure of claim 1 wherein the first channel region is juxtaposed with the second channel region.

8. The structure of claim 7 further comprising:
    a trench isolation region arranged between the first channel region and the second channel region.

9. The structure of claim 1 wherein the first field-effect transistor and the second field-effect transistor are p-type field-effect transistors, and the third field-effect transistor is an n-type field-effect transistor.

10. A method of comprising:
    forming a first channel region containing a first semiconductor material and a second channel region containing a second semiconductor material over a buried insulating layer of a silicon-on-insulator substrate;
    forming a first gate electrode of a first field-effect transistor over the first channel region;
    forming a second gate electrode of a second field-effect transistor over the second channel region; and forming a third gate electrode of a third field-effect transistor over a third channel region that is comprised of a section of a device layer of the silicon-on-insulator substrate, wherein the third channel region has a first thickness, and the second channel region has a second thickness that is greater than the first thickness of the third channel region, the first semiconductor material of the first channel region has a first germanium concentration, and the second semiconductor material of the second channel region has a second germanium concentration that is greater than the first germanium concentration in the first semiconductor material of the first channel region.

11. The method of claim 10 wherein forming the first channel region containing the first semiconductor material and the second channel region containing the second semiconductor material over the buried insulating layer of the silicon-on-insulator substrate comprises:

epitaxially growing a semiconductor layer containing germanium over a first device area and a second device area of the device layer of the silicon-on-insulator substrate;

forming a first hardmask layer over the semiconductor layer in the first device area; and after forming the first hardmask layer, forming the first semiconductor material of the first channel region by combining the semiconductor layer and the device layer in the first device area with a thermal process.

12. The method of claim 11 wherein the first hardmask layer is formed over the semiconductor layer in the second device area, and further comprising:

before the thermal process, removing the first hardmask layer from the semiconductor layer in the second device area to expose the semiconductor layer in the second device area.

13. The method of claim 12 wherein the thermal process transports germanium from the semiconductor layer into the second device area of the device layer to form the second semiconductor material of the second channel region.

14. The method of claim 13 wherein the semiconductor layer is comprised of silicon-germanium.

15. The method of claim 14 wherein the semiconductor layer includes a germanium concentration ranging from 2% to 50%.

16. The method of claim 11 further comprising:

before epitaxially growing the semiconductor layer, forming a second hardmask layer over a third device area of the device layer of the silicon-on-insulator substrate, wherein the device layer in the third device area provides the third channel region of the third field-effect transistor.

17. The method of claim 11 wherein the thermal process is performed with the silicon-on-insulator substrate placed in an ambient atmosphere having an oxygen content, and the first hardmask layer is comprised of a dielectric material that is impermeable to oxygen from the ambient atmosphere.

18. The method of claim 10 wherein the first channel region has a third thickness, and the second thickness of the second channel region is less than the third thickness of the first channel region.

19. The method of claim 10 wherein the first channel region is arranged in direct contact with the buried insulating layer of the silicon-on-insulator substrate.

20. The method of claim 19 wherein the second channel region is arranged in direct contact with the buried insulating layer of the silicon-on-insulator substrate.

* * * * *